United States Patent [19]
Albert et al.

[11] Patent Number: 5,495,253
[45] Date of Patent: Feb. 27, 1996

[54] SOLITON REJECTION FILTER

[75] Inventors: Stuart D. Albert, Bricktown; William J. Skudera, Jr., Oceanport, both of N.J.

[73] Assignee: The United States of America as represented by the Secretary of the Army, Washington, D.C.

[21] Appl. No.: 340,926

[22] Filed: Nov. 17, 1994

[51] Int. Cl.$^6$ .................................................. G01S 7/34
[52] U.S. Cl. ........................ 342/159; 342/175; 342/195; 342/19
[58] Field of Search ...................................... 342/159, 175, 342/16, 17, 19, 93, 162, 195

[56] References Cited

U.S. PATENT DOCUMENTS

| | | | |
|---|---|---|---|
| 4,855,696 | 8/1989 | Tan et al. ................................ | 333/20 |
| 4,913,507 | 4/1990 | Stamnitz et al. ........................ | 385/122 |
| 4,965,581 | 10/1990 | Skudera et al. ......................... | 342/19 |
| 5,023,574 | 6/1991 | Anklam et al. ......................... | 333/20 |
| 5,305,006 | 4/1994 | Lee .......................................... | 341/155 |
| 5,422,607 | 6/1995 | McEwan ................................. | 333/20 |

*Primary Examiner*—John B. Sotomayor
*Attorney, Agent, or Firm*—Michael Zelenka; William H. Anderson

[57] ABSTRACT

A soliton rejection filter circuit is provided, for use in RF signal processing, for isolating a low level signal in the presence of stronger nearby interfering signals and detecting its modulation over a wide communication bandwidth centered at a relatively low RF frequency. The soliton filter circuit includes a nonlinear transmission line and a filter circuit.

4 Claims, 2 Drawing Sheets

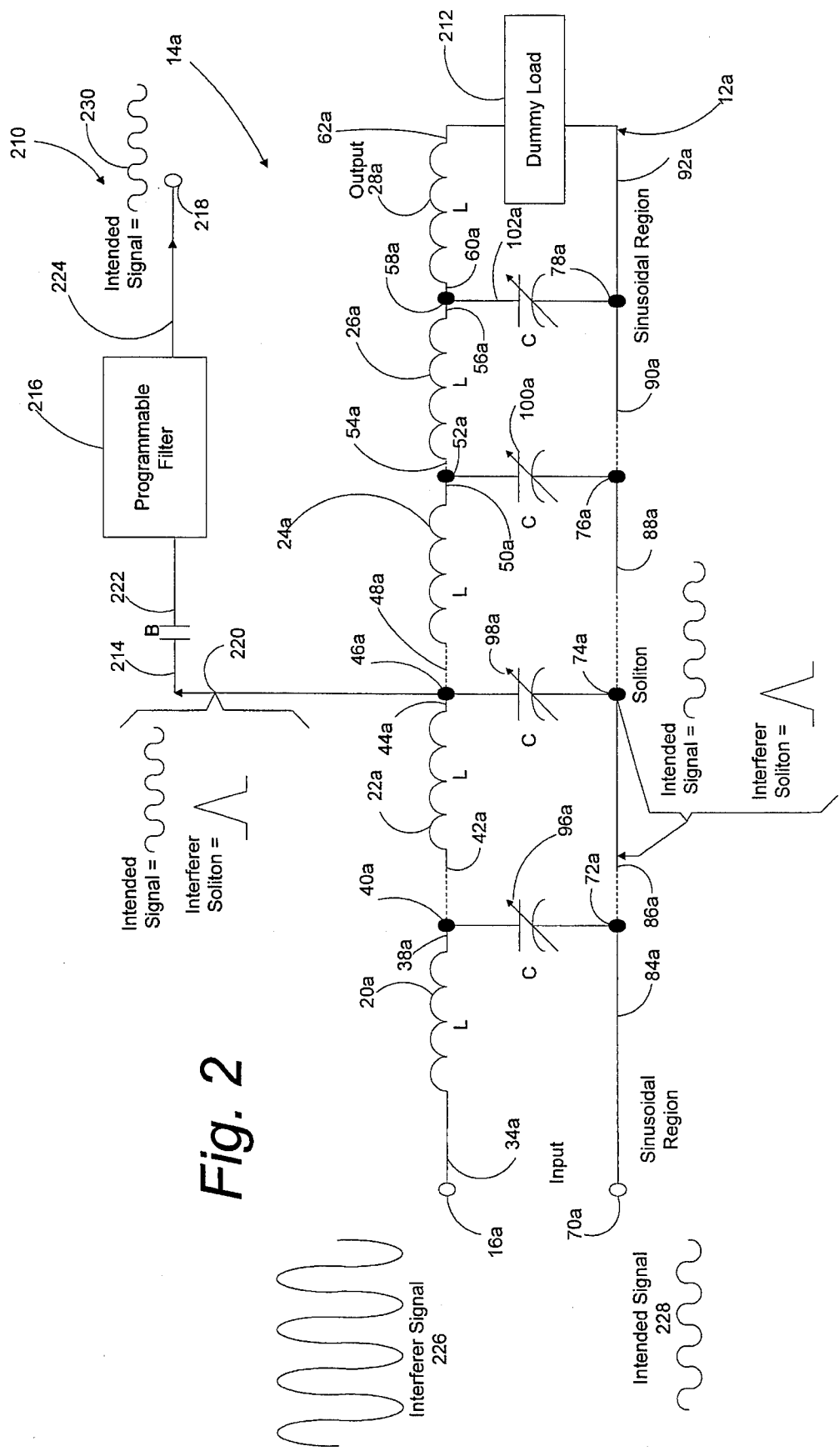

SOLITON REJECTION FILTER

GOVERNMENT INTEREST

The invention described herein may be manufactured, used and licensed by or for the Government for governmental purposes without the payment to us of any royalties thereon.

FIELD OF THE INVENTION

The present invention relates to a soliton rejection filter, and in particular the invention relates to a soliton interference rejection filter circuit which has a nonlinear transmission line (NTL) in combination with a filter circuit.

BACKGROUND OF THE INVENTION

A prior art interference rejection circuit is described in U.S. Pat. No. 4,965,581, issued Oct. 23, 1990, to the same inventors as this invention. That circuit includes an RF input terminal, a chirp-Z transform system which separates the time domain signal into two paths, a normally ON gate means for passing said time domain signal to an output, and a pulse means for causing strong frequency components in said time domain signal having a magnitude greater than a predetermined level to turn the gate means OFF for a period of time to substantially block the strong frequency components.

One problem with the prior art circuit is that the percentage of the bandwidth is not wide enough to cover frequencies below UHF.

A second problem of the prior art circuit is that its power handling is not sufficient to handle very high level interfering signals.

One object of the present invention is to provide a soliton interference rejection circuit and process which has a bandwidth that is wide enough to cover frequencies below UHF.

Another object of the present invention is to provide a soliton interference rejection circuit which has a power handling capability that is sufficient to handle very high level interfering signals.

Related references are listed hereafter.

1. "The Properties of Phase Modulated Soliton Trains", by Kimio Suzuki, & et al., published in the Japanese Journal of Applied Physics, Vol. 12, No. 3, pg. 361–365, March 1973.
2. "Experimental and Theoretical Study of the Recurrence Phenomena in Nonlinear Transmission Line", by Kazuhiro Fukushima, et al., published in the Journal of the Physical Society of Japan, Vol. 48, No. 3, pg. 1029–1035, March 1980.
3. "A 32 Tap digitally Controlled Programmable Transversal Filter", by Carl Panasik, et al., published in the 1988 Ultrasonics Symposium Proceedings, Vol. 1, pg. 151–154.
4. "Properties of Solitary Waves as Observed on a Nonlinear Dispersive Transmission Line", by Joseph Kolosick, et al., published in the Proceedings of the IEEE, Vol. 62, No. 5, pg. 578–581, May 1974.
5. "Apparatus and Method for Real Time Interference Signal Rejection", by S. Albert & W. Skudera, Jr., patent application Ser. No. 07/886,203, CECOM Docket No. 4683, filed May 21, 1992.
6. "Soliton Propagation along Periodic-Loaded Transmission Line", by D. Jager, Applied Physics, Vol. 16, pg. 35–38, 1978.

References 1 and 2 describe a nonlinear transmission line method to produce soliton waves.

Reference 3 describes a 32 tap digitally controlled programmable transversal filter.

Reference 4 describes differential equations for developing soliton waves from RF input signals.

Reference 5 describes an adaptive configuration of a filter, which can replace a programmable filter.

Reference 6 describes a relatively high frequency nonlinear transmission line.

SUMMARY OF THE INVENTION

According to the present invention, a soliton interference rejection circuit is provided. This rejection circuit includes a nonlinear transmission line, in combination with a gating circuit or programmable filter circuit.

By using the nonlinear transmission line, the location of where the soliton waves occur is predetermined; and by using the gating circuit or programmable filter circuit, the undesired interferer signal is taken out.

BRIEF DESCRIPTION OF THE DRAWING

The foregoing and other objects, features and advantages will be apparent from the following description of the preferred embodiment of the invention as illustrated in the accompanying drawings.

FIG. 2 is a schematic block diagram of a second embodiment of a soliton rejection filter according to the invention.

DESCRIPTION OF THE PREFERRED EMBODIMENTS

Figure 1:
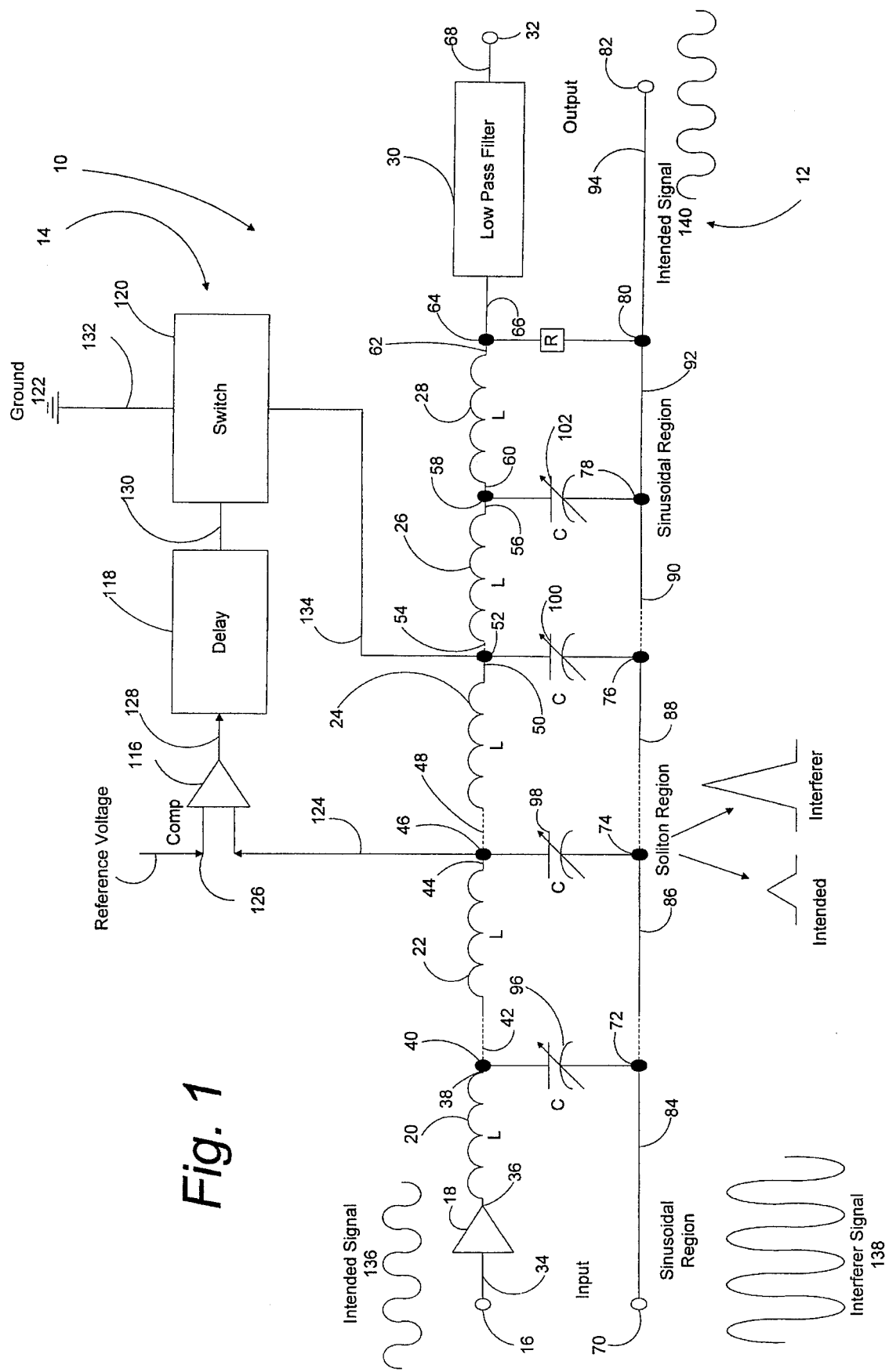
FIG. 1 is a schematic block diagram of a first embodiment of a soliton rejection filter according to the invention.

As shown in FIG. 1, a soliton rejection filter circuit 10 is provided. Rejection circuit 10 has a nonlinear transmission line or ladder-type circuit 12 and has a connecting filter circuit 14. Line 12 has a first input terminal 16, an amplifier 18, and a first (L) inductance 20. Line 12 also has a series of further inductances (L), which in FIG. 1 are represented by numerals 22, 24, 26 and 28; and line 12 has a low pass filter 30, and an output terminal 32.

Input terminal 16 has a first conductor 34, which connects to an input pin of amplifier 18. Amplifier 18 has a conductor 36 which connects to an input pin of first (L) inductance 20. First (L) inductance 20 has a conductor 38 which connects to a circuit junction 40. Circuit junction 40 is connected to a further series of inductances, circuit junctions, and conductors represented by dashed line 42 all of which connects to an input pin of (L) inductance 22. The number of sections represented by numeral 42 will depend on a number of factors such as, the type of sinusoidal wave form, voltage, capacitance of the circuit, etc. Given this disclosure those skilled in art will be readily able to model a circuit for differing applications. The only requirement being that number of sections convert the sinusoidal wave to a soliton. Accordingly, this section has been labelled the sinusoidal region on FIG. 1.

(L) inductance 22 has a conductor 44 which connects to an input pin of circuit junction 46. Circuit junction 46 connects to a further series of sections represented by dashed line 48, all of which connects to an input pin of (L)

inductance 24. Similar to section 42, section 48 is formed of a series of similar circuit sections and provides for the signal path of the soliton waves according to the present invention. The soliton region terminates with a similar section which includes (L) inductance 24 and a conductor 50, and which connects to an input pin of circuit junction 52.

Circuit junction 52 is connected to a third series of sections represented by dashed line 54, which connects to an input pin of (L) inductance 26. Also similar to sections 42 and 48, section 54 is formed of a series of similar circuit sections and forms a circuit path for a second sinusoidal region. (L) inductance 26 has a conductor 56, which connects to an input pin of circuit junction 58. Circuit junction 58 has a conductor 60, which connects to an input pin of (L) inductance 28.

(L) inductance 28 has a conductor 62 which connects to a circuit junction 64. Circuit junction 64 has a conductor 66, which connects to an input pin of low pass filter 30. Low pass filter 30 has a conductor 68, which connects to output terminal 32.

Line 12 also has a second input terminal 70, circuit junctions 72, 74, 76, 78 and 80, and an output terminal 82.

Similar to the intended signal line, the interferer signal line is comprised of these sections, a sinusoidal section, a soliton section, and another sinusoidal section.

The first sinusoidal section includes an input terminal 70 which has a conductor 84 and which connects to an input pin of circuit junction 72. Circuit junction 72 is connected to a series of similar sections, which are represented by dashed line 86, and which connects to an input pin of circuit junction 74.

The soliton section includes a circuit junction 74 which is connected to a series of similar sections, which are represented by dashed line 88 and which connects to an input pin of circuit junction 76.

The second sinusiodal section includes a circuit junction 76 which is further connected to a series of similar sections which are represented by dashed line 90 and which connects to an input pin of circuit junction 78. Circuit junction 78 has a conductor 92, which connects to an input pin of circuit junction 80. Circuit junction 80 has a conductor 94, which connects to an input pin of output terminal 82.

Circuit junction 72 connects to a voltage dependent capacitance or capacitor (C) 96, which may be a varactor diode. Capacitor 96 connects to junction 40. Junction 74 connects to a capacitor (C) 98 which connects to junction 46. Junction 76 connects to a capacitor (C) 100, which connects to junction 52. Junction 78 connects to a capacitor (C) 102, which connects to junction 58. Junction 80 connects to a resistor 104, which connects to junction 64. Similar to the description above, the capacitor connections are repeated in dashed sections 42/86, 48/88, and 54/90.

Filter circuit 14 includes a comparator (Comp.) 116, a delay 118, a switch 120, and a ground 122. Junction 96 has a conductor 124, which connects to an input pin of comparator 16. A conductor 126 from a reference voltage source (not shown) connects to a second input pin of comparator 116.

Comparator 116 has a conductor 128, which connects to an input pin of delay 118. Delay 118 has a conductor 130, which connects to an output pin of switch 120. Ground 122 has a conductor 132, which connects to an input pin of switch 120. Switch 120 has a conductor 134, which connects to junction 52.

Input terminals 16 and 70 both simultaneously receive an intended and an interfering signal. Output terminal 82 outputs intended signal 140.

In operation, an RF signal of sufficient amplitude is applied to the input of FIG. 1, and as described in references No. 1 and 4, a soliton wave is received at the output. The conversion equations for developing soliton waves from RF input signals are complex differential equations that are given in reference No. 4. In simplistic terms, what happens is that the nonlinear transmission line is both non-linear and dispersive to an RF sinusoidal wave. Also, it is well known that the phase velocity of a sinusoidal wave propagating in a transmission line is proportional to the inverse of the square root of the series inductance, L, times the shunt capacitance, C. Therefore, if the capacitance values in each unit section of the transmission line changes as the sinusoidal wave's amplitude changes, then the phase velocity of the signal will become spread out or become dispersive over time. Thus, the components of the initial sinusoidal signal will propagate at different speeds over time. This dispersion, happens because varactor diodes are normally utilized as the capacitors in these nonlinear transmission lines, and they change their "C" values inversely to the amplitude (or the voltage) of the input signal. This implies that the higher voltage parts of the input sinusoidal wave form will propagate faster than the lower voltage or amplitude parts of the same. As a result, the CW wave becomes more and more distorted as it continues to move through each unit section of the nonlinear transmission line (NTL) 12. At a predetermined location along the NTL, that is dependent upon the parameters of the circuit components, the signal looks like a series of pulses with sharp discontinuities that resemble a shock wave or what is called a soliton wave. In addition, when two simultaneous sinusoidal waves are introduced at the input to the NTL, and if one signal is stronger (larger amplitude) than the other, then the stronger signal will propagate faster than the slower signal. Therefore, two soliton pulse trains will form with different amplitudes in the NTL, and will be time shifted from each other. This time difference property between the pulse trains will be utilized in this disclosure to permit time excision methods to be performed. Also, if the now soliton wave trains continues further down the NTL sections they will again begin to turn themselves back into distorted CW type signals, and finally at another predetermined location back into well defined CW shaped waves. This reappearance of the CW signals occurs because their various respective parts will again appear to catch-up, although they are now shifted by a complete wavelength and cannot be distinguished from the initial signal or signals. Thus, one can predetermine (see reference No. 2) the location or region where the soliton waves occurs in the NTL 12. Then by connecting a comparator circuit 116 and series RF switches 120 as shown in FIG. 1 to the desired unit NTL section one can simply gate out the undesired interferer signal.

In more detail what happens is that the comparator (Comp.) 116, in FIG. 1 is set at a reference voltage such that the comparator 116 will output or change state only when a stronger (higher voltage) and faster (less time to reach Comp.) soliton pulse signal appears at the Comp. input. Also, when a lower level and slower soliton signal appears at the input to the Comp. 116, no output occurs. Thus, when the Comp. 116 outputs a signal it is passed to a delay line 118 to account for circuit delays, and then passed on to a switch input that closes the switch 120 and grounds out or shorts out the high level interfering soliton signal that still occurs in the NTL 12. As soon as the voltage pulse is removed from the switch 120, it again opens and allows the slower and lower level desired signal to continue to propagate down the NTL 12. Since some distortion will probably occur due to the switching action on the NTL 12, a low pass filter 30 is used to help remove these transient signals. Also, a standard pulse widening circuit (not shown) could be utilized after the delay line to further remove any remaining spurious signals in the NTL that are due to the switching action. Therefore, the only signal that will appear across the resistive (R) 104 load is the desired or intended signal. An amplifier (Amp) 18 is shown in FIG. 1 to ensure that a soliton occurs in the NTL 12 for the intended signal, i.e., to ensure that the intended signal has sufficient amplitude to generate a soliton wave.

As shown in FIG. 2, a second embodiment 210 according to the invention is provided. Parts of second embodiment 210 which are the same as first embodiment 10, have the same numerals but with a subscript "a" added thereto. Embodiment or circuit 210 has a nonlinear transmission line 12a and a programmable filter circuit 14a.

Line 12a has a first input terminal 16a, a first (L) inductance 20a, a series of further inductances (L), which in FIG. 2 are represented by numerals 22a, 24a, 26a and 28a, and a dummy load 212.

Input terminal 16a has a first conductor 34a, which connects to an input pin of (L) inductance 20a. First (L) inductance 20a has a conductor 38a, which connects to junction 40a. Junction 40a is connected to a further series of inductances, junctions and conductors, represented by dash line 42a, all of which connects to an input pin of (L) inductance 22a.

The number of sections represented by numeral 42a will depend on a number of factors such as, the type of sinusoidal wave form, voltage, capacitance of the circuit, etc. Given this disclosure those skilled in art will be readily able to model a circuit for differing applications. The only requirement being that number of sections convert the sinusoidal wave to a soliton. Accordingly, this section has been labelled the sinusoidal region in FIG. 2.

(L) inductance 22a has a conductor 44a, which connects to junction 46a. Junction 46a connects to a further series of sections represented by dash line 48a, all of which connects to an input pin of (L) inductance 24a.

Similar to section 42a, section 48a is formed of a series of similar circuit sections and provides for the signal path of the soliton waves according to the present invention. The soliton region terminates with a similar section which includes (L) inductance 24a and a conductor 50a, and which connects to a junction 52a. Junction 52a is connected to a third series of sections represented by dash line 54a, which connects to an input pin of (L) inductance 26a.

Also similar to sections 42a and 48a, section 54a is formed of a series of similar circuit sections and forms a circuit path for a second sinusoidal region.

(L) inductance 26a has a conductor 56a, which connects to junction 58a. Junction 58a has a conductor 60a, which connects to an input pin of (L) inductance 28a. (L) inductance 28a has a conductor 62a, which connects to a first pin of dummy load 212.

Line 12a also has an input terminal 70a, and has circuit junctions 72a, 74a, 76a and 78a.

Similar to the intended signal line, the interferer signal line is comprised of these sections, a sinusoidal section, a soliton section and another sinusoidal section.

The first sinusoidal section includes an input terminal 70a which has a conductor 84a and which connects to an input pin of junction 72a. Junction 72a is connected to a series of similar sections, which are represented by dash line 86a, and which connects to an input pin of circuit junction 74a.

The soliton section includes a circuit junction 74a, which is connected to a series of similar sections which are represented by dash line 88a and which connects to an input pin of junction 76a. The second sinusoidal section includes junction 76a which is further connected to a series of similar sections which are represented by dash line 90a and which connects to an input pin of junction 78a. Junction 78a has a conductor 92a, which connects to a second pin of dummy load 212.

Junction 72a connects to a voltage dependent capacitance or (C) capacitor 96a, which connects to junction 40a. Junction 74a connects to a capacitor 98a, which connects to junction 46a. Junction 76a connects to a capacitor 100a, which connects to junction 52a. Junction 78a connects to a capacitor 102a, which connects to junction 58a. Similar to the description above, the capacitor connections are repeated in dashed sections 42a/86a and 48a/88a and 54a/90a.

Programmable circuit 14a includes a blocking (B) capacitor 214, a programmable filter 216, and an output terminal 218. Junction 46a has a conductor 220, which connects to an input lead of blocking capacitor 214. Blocking capacitor 214 has a conductor 222, which connects to an input lead of programmable filter 216. Filter 216 has a conductor 224, which connects to an input pin of output terminal 218.

Input terminal 16a and 70a simultaneously receive both interferer signal 226 and intended signal 230.

In operation, FIG. 2 shows how one can effectively enhance the frequency separation between the interferer and intended signal through the use of a NTL 12a combined with a programmable or adaptive filter 14a. FIG. 2 is similar to FIG. 1 except that the Comp. 116 delay line 118 and switch circuit 120 are replaced by a capacitor (B) 214 and a programmable filter 216. Also, the Amp. 18 has been removed to ensure that the intended signal does not degenerate into a soliton wave in the soliton region of the NTL 12a. Thus the intended signal remains as a sinusoidal wave in the NTL 12a and it is applied to the programmable filter 216 since the "B" capacitor 214 is a blocking capacitor that prevents DC terms from reaching the filter 216. However, the interferer is changed into a soliton pulse at (B) 214 via the NTL 12a and since its spectral energy is primarily located at high frequencies due to the sharp rise/fall time of the pulse, it now has a much wider frequency separation with the intended signal than it had at the input to the NTL 12a. The DC and other lower frequency terms of the soliton pulse is not permitted at the input to the programmable filter via the "B" capacitor 214. The programmable filter 216 can now be set to receive and to pass only the intended signal. Also, this filter could be set-up in an adaptive configuration, if the intended signal frequency is unknown, simply by replacing the programmable filter 216 of this disclosure with either of the circuits shown in reference No. 5. The remaining signal energy in the NTL 12a is then terminated in the dummy load 212 as shown in FIG. 2.

For simplicity, only one soliton pulse is shown in both FIG. 1 and FIG. 2, however, a series of repetitive pulses are generated. In addition, this method could be operated at higher center frequencies simply by changing and/or rearranging the "C" and "L" parameters of the NTL 12a. Higher frequency NTL have already been demonstrated; see, for example, reference No. 6.

Advantages of the circuits 10 and 210 are indicated hereafter.

A) Circuits 10 and 210 can satisfy a relatively wide bandwidth requirement at a relatively low center frequency, which is used in normal radio frequency communication systems.

B) Circuits 110 and 210 have a relatively high power handling capability.

C) Circuits 10 and 210 are relatively inexpensive to build; and are not too complex to build.

D) Circuits 10 and 210 can isolate a low level signal in the presence of stronger nearby interfering signals and detect its modulation over a relatively wide communication bandwidth centered at relatively low RF frequencies.

E) Circuit 210 overcomes the problem of a minimum amount of frequency separation between the interferer and the desired signal, that is pass band selectivity, because circuit 210 allows their nonlinear transmission line to effectively create a larger output frequency separation from a smaller frequency separation and then apply this result to a filter circuit.

While the invention has been described in its preferred embodiment, it is to be understood that the words which have been used are words of description rather than limitation and that changes may be made within the purview of the appended claims without departing from the true scope and spirit of the invention in its broader aspects.

For example, the ability to remove unwanted interference from RF receivers should be useful to various commercial radio receivers. In many applications, these receivers including audio types need to have high quality reception of the desired signal so that distortions are kept to an absolute minimum. These include standard AM/FM, audio, and stereo systems that require desired signal fidelity.

What is claimed is:

1. A soliton interference rejection circuit comprising:

two input terminals both simultaneously receiving an intended signal and an interferer signal;

a nonlinear transmission line for producing soliton waves and for predetermining a soliton region where the soliton waves occur, the nonlinear transmission line being coupled to the two input terminals; and a filter circuit for removing the undesired interferer signal, the filter circuit being coupled to the nonlinear transmission line at the soliton region.

2. The rejection circuit of claim 1, wherein the filter circuit includes:

a comparator for comparing a signal from the nonlinear transmission line at the soliton region thereof to a reference voltage, the comparator being coupled to the nonlinear transmission line:

a delay unit coupled to the comparator for accounting for circuit delays; and a switch unit coupled to the delay unit for shorting out a high level interfering soliton signal that occurs in the nonlinear transmission line.

3. The rejection circuit of claim 1, wherein the filter circuit includes:

a blocking capacitor coupled to the nonlinear transmission line for preventing DC terms from passing therethrough;

a programmable filter coupled to the blocking capacitor for receiving and only passing the intended signal; and an output terminal coupled to the programmable filter.

4. The rejection circuit of claim 1, wherein the nonlinear transmission line is a ladder type of transmission line and includes:

a first elongate line portion having a series of inductances with respective conductors with junctions;

a second elongate line portion disposed substantially parallel to the first elongate line portion, the second line portion having a series of conductors with junctions; and a plurality of transverse conductors disposed transversely to the first and second line portions, the transverse conductors having respective voltage dependent capacitors interconnecting respective opposite pairs of the junctions.

* * * * *